(12) United States Patent
Sasaki

(10) Patent No.: US 7,145,623 B2
(45) Date of Patent: Dec. 5, 2006

(54) FLAT PANEL DISPLAY HAVING CONCENTRATED SWITCHING ELEMENT ARRANGEMENT AND METHOD OF MANUFACTURING THE SAME

(75) Inventor: Nobuo Sasaki, Kawasaki (JP)

(73) Assignee: Sharp Kabushiki Kaisha, Osaka (JP)

( * ) Notice: Subject to any disclaimer, the term of this patent is extended or adjusted under 35 U.S.C. 154(b) by 102 days.

(21) Appl. No.: 10/280,848

(22) Filed: Oct. 25, 2002

(65) Prior Publication Data

US 2003/0147019 A1 Aug. 7, 2003

(30) Foreign Application Priority Data

Feb. 6, 2002 (JP) .............................. 2002-028954

(51) Int. Cl.
G02F 1/136 (2006.01)
G02F 1/1343 (2006.01)
G09G 3/36 (2006.01)

(52) U.S. Cl. .................... 349/144; 349/42; 349/43; 349/48; 349/143; 345/92

(58) Field of Classification Search ............... 349/43, 349/143, 144, 48, 42; 257/72; 345/90, 92
See application file for complete search history.

(56) References Cited

U.S. PATENT DOCUMENTS

| 4,097,131 | A | * | 6/1978 | Nishiyama ................... 349/113 |
| 4,936,656 | A | * | 6/1990 | Yamashita et al. ............. 349/8 |
| 5,132,820 | A | * | 7/1992 | Someya et al. ............... 349/43 |
| 5,247,289 | A | * | 9/1993 | Matsueda .................... 345/98 |
| 5,946,058 | A | | 8/1999 | Kamada et al. ............... 349/42 |
| 6,011,531 | A | | 1/2000 | Mei et al. |
| 6,392,628 | B1 | * | 5/2002 | Yamazaki et al. ............. 345/98 |
| 6,414,665 | B1 | * | 7/2002 | Libsch et al. ................. 345/92 |
| 6,524,877 | B1 | | 2/2003 | Nakazawa et al. ............ 438/48 |
| 6,850,219 | B1 | * | 2/2005 | Aoyama et al. ............. 345/103 |
| 2002/0031876 | A1 | | 3/2002 | Hara et al. .................. 438/166 |

FOREIGN PATENT DOCUMENTS

| EP | 1 017 108 | 7/2000 |
| EP | 1 020 839 | 7/2000 |
| EP | 1 130 566 | 9/2001 |
| JP | 0 178 148 | 4/1986 |
| JP | 62-218987 | 9/1987 |
| JP | 03-033724 | 2/1991 |
| JP | 06-289431 | 10/1994 |
| JP | 07-092501 | 4/1995 |
| JP | 9-096839 | 4/1997 |

(Continued)

*Primary Examiner*—Andrew Schechter
*Assistant Examiner*—Michael H. Caley
(74) *Attorney, Agent, or Firm*—Greer, Burns & Crain, Ltd

(57) ABSTRACT

The invention provides a flat panel display and a method of manufacturing the same in which the throughput of polycrystallization can be improved in polycrystallizing an amorphous silicon layer formed on a substrate using a low temperature polysilicon manufacturing process. Four gate bus lines are concentrated in the vicinity of a predetermined range indicated by the vertical arrow. The range resides in the vicinity of the boundary between pixels in the second row and pixels in the third row and substantially equally extend across those groups of pixels. Four each of the plurality of gate bus lines and TFT's are combined into a set in the order of row numbers, and at least the TFT's are concentrated in respective ranges X that extend substantially in the middle of respective groups of pixels each consisting of four rows.

9 Claims, 15 Drawing Sheets

FOREIGN PATENT DOCUMENTS

| | | |
|---|---|---|
| JP | 10-222097 | 8/1998 |
| JP | 2001-144300 | 5/2001 |
| JP | 2001-196597 | 7/2001 |

\* cited by examiner

1

FLAT PANEL DISPLAY HAVING CONCENTRATED SWITCHING ELEMENT ARRANGEMENT AND METHOD OF MANUFACTURING THE SAME

BACKGROUND OF THE INVENTION

1. Field of the Invention

The present invention relates to a flat panel display utilizing a thin film organic electro-luminescent element or a liquid crystal and a method of manufacturing the same.

2. Description of the Related Art

There are increasing expectations for flat panel displays such as thin film organic EL displays and liquid crystal displays (LCD's) as displays that replace CRT's (cathode-ray tubes). The main stream of thin film organic EL displays and liquid crystal displays is active matrix type displays that have a TFT (thin film transistor) as a switching element in each pixel to achieve high speed response and lower power consumption. In an active matrix type flat panel display, a TFT must be incorporated in each of pixels that are provided in the form of a matrix on a substrate. In order to provide a greater display screen at a lower cost, pixel TFT's must be formed on a glass substrate that is inexpensive and easy to provide with a large size instead of a quartz glass substrate that is expensive.

TFT's to be formed on a glass substrate include a-Si TFT's having a channel region formed of amorphous silicon (a-Si) and having carrier mobility of about 0.5 $cm^2/Vs$ and p-Si TFT's having carrier mobility of about 120 $cm^2/Vs$ in which an a-Si layer in a channel region is polycrystallized into poly (polycrystalline) silicon (p-Si) using a low-temperature polysilicon manufacturing process. It is desirable to use p-Si TFT's having high carrier mobility to achieve high speed response and to provide a greater screen or high aperture ratio in an active matrix type flat panel display.

One method for forming p-Si TFT's using a low temperature polysilicon manufacturing process is the excimer laser crystallization method in which a p-Si layer is formed by irradiating an a-Si layer with a pulse-oscillation excimer laser. The excimer laser crystallization method will be described with reference to FIG. 15. FIG. 15 is a perspective view of a glass substrate 100 whose top surface is irradiated with pulse laser light L10 emitted by a XeCl excimer pulse laser 102. A silicon oxide film ($SiO_2$ film) 104 is formed on the top surface of the glass substrate 100 that is placed on an X-Y stage (not shown), and an a-Si layer 106 is formed on the same.

The pulse laser light L10 emitted by the excimer pulse laser 102 deflected by a reflection mirror 108 substantially at right angles to enter a projection optical system 110 at which it is transformed into a divergent pencil of rays having an elongate rectangular projection plane to irradiate the a-Si layer 106. The a-Si layer 106 on the top surface of the glass substrate 100 is sequentially irradiated with the pulse laser light L10 with the X-Y stage that is not shown moved on a step-and-repeat basis, which makes it possible to change the entire a-Si layer 106 into a p-Si layer 112.

For example, the excimer pulse laser 102 emits pulse laser light L10 having 300 pulses/sec, a pulse width PW of 30 ns, a wavelength λ of 308 nm, and power fluctuations of ±10% or less. An area A melt by a single pulse (a surface of the a-Si layer 106 on which the pulse laser light L10 is projected) has a size of 27.5 cm (W)×0.4 mm (L), for example. A relative moving distance per one pulse is 20 μm/pulse in the L-direction (with an overlap of 95%), for example. The scanning speed of the laser light relative to the X-Y stage is 6 mm/sec, for example.

Thus, in the case of excimer laser crystallization, an elongate linear pencil of rays is scanned on the glass substrate 100 having the a-Si layer 106 deposited thereon, each laser pulse being scanned stepwise with an overlap of about 95% in the direction of the minor axis (L-direction in FIG. 15) of the beam spot. The entire a-Si layer 106 on the glass substrate 100 is thus polycrystallized into a p-Si layer 112.

As described above, the use of the excimer laser crystallization method makes it possible to polycrystallize a great width W on a substrate at a time. In the case of an LCD, however, the TFT provided at each pixel is preferably formed in a region that is as small as possible to provide the pixel with a high aperture ratio. In the case of a thin film organic El display, such a region is preferably as small as possible to provide an organic EL element with a great emission area. That is, there are restrictions on a region to be polycrystallized of an a-Si layer on a glass substrate using a low temperature polysilicon manufacturing process. However, since a wide range of an a-Si layer on a substrate is polycrystallized at a time according to the excimer laser crystallization method, a problem arises in that laser light can irradiate even a region where no TFT is to be formed and no crystallization is therefore required and in that polycrystallization suffers from a low throughput because of a low scanning speed of laser light relative to an X-Y stage.

SUMMARY OF THE INVENTION

The invention provides a flat panel display and a method of manufacturing the same in which a high throughput of crystallization can be achieved in forming pixel switching elements by crystallizing a semiconductor layer formed on a substrate.

There is provided a flat panel display having a switching element provided in association with each pixel, characterized in that switching elements associated with different pixels are concentrated in a predetermined region.

DETAILED DESCRIPTION OF THE PREFERRED EMBODIMENTS

Flat panel displays according to preferred embodiments of the invention and methods of manufacturing the same will now be described with reference to FIGS. 1 to 14. The embodiments employ a CW lateral crystallization method for improving the throughput of crystallization of an a-Si layer in a region of a glass substrate where TFT's are to be formed.

Figure 1:
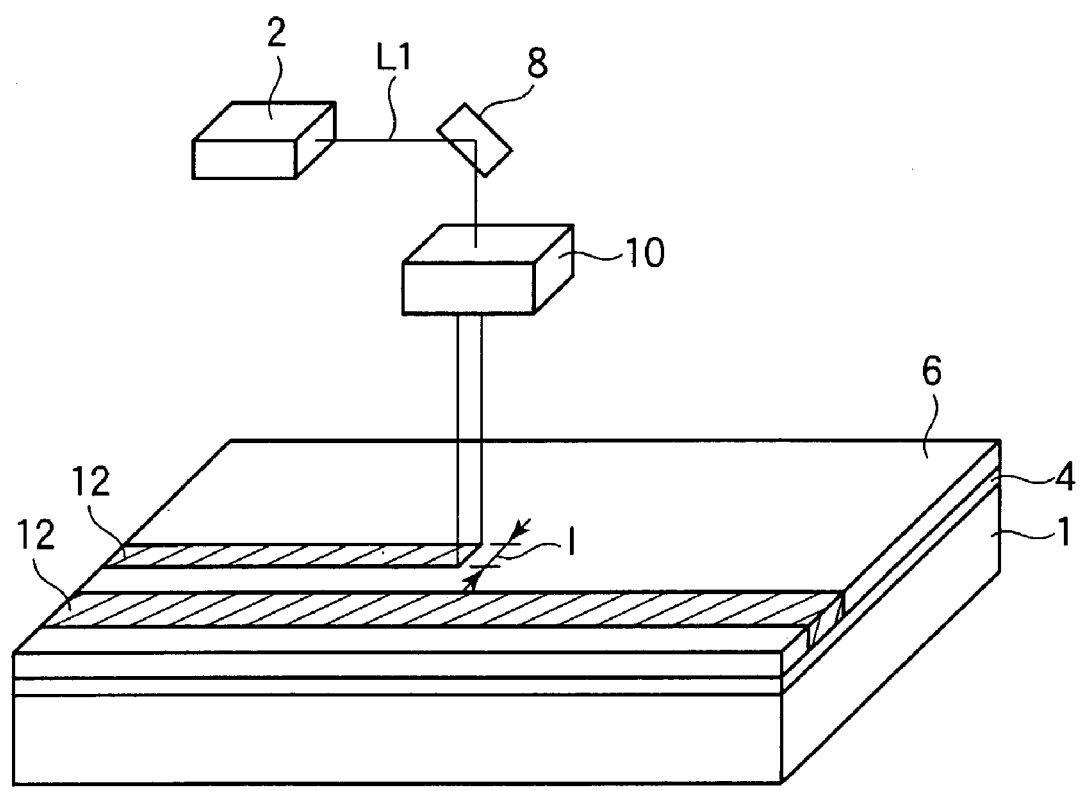
FIG. 1 illustrates a CW lateral crystallization method according to an embodiment of the invention.

The CW lateral crystallization method will now be described with reference to FIG. 1. FIG. 1 is a perspective view of a glass substrate 1 a top surface of which is irradiated with laser light L1 that is continuous light emitted by a CW (continuous wave oscillation) solid state laser 2. A silicon oxide film ($SiO_2$ film) 4 is formed on the top surface of the glass substrate 1 that is placed on an X-Y stage (not shown), and an a-Si layer 6 is formed on the same.

The laser light L1 emitted by the CW solid state laser 2 is deflected by a reflection mirror 8 substantially at right angles to enter a projection optical system 10 at which it is shaped into a parallel pencil of rays having an elliptic or rectangular projection plane to irradiate the a-Si layer 6. An arbitrary position of the a-Si layer 6 can be changed into a p-Si layer 12 by sequentially irradiating the a-Si layer 6 on the top surface of the glass substrate 1 with the laser light L1 while moving the X-Y state (not shown) on a step-and-repeat basis.

Continuously oscillated laser light L1 having a wavelength λ of 532 nm and power fluctuations of ±1% or less is emitted by the CW solid state laser 2. A melting width (the width of a beam spot of the laser light L1 on the a-Si layer 6) 1 ranges from 20 to 150 μm depending on the power of the laser light. The scanning speed of the laser light relative to the X-Y stage is in the range from 20 cm/sec to 2 m/sec.

According to the CW lateral crystallization method, for example, a linear pencil of rays having a width as small as about 150 μm is continuously scanned on the glass substrate 1 having the a-Si layer 6 deposited thereon in the direction of the minor axis of the beam spot (a direction orthogonal to the l-direction in FIG. 1) to polycrystallize the a-Si layer 6. Since laser light is emitted through continuous oscillation according to the CW lateral crystallization method, the power of the laser light is lower than that of pulse-oscillated laser light used in the excimer laser crystallization method. While the width of a region where a-Si can be melted is therefore narrower, a region where no crystallization is required will not be irradiated with laser light. Therefore, the CW lateral crystallization method makes it possible to improve the throughput of crystallization because the a-Si layer 6 is not irradiated with laser light in regions where no TFT is to be formed. Thin films to be crystallized using the CW lateral crystallization method are not limited to a-Si films, and p-Si films and semiconductor films in general such as amorphous or polycrystalline Ge (germanium) and SiGe films may be subjected to CW lateral crystallization.

It has been revealed that the CW lateral crystallization method utilizing a CW solid state laser makes it possible to provide TFT's having carrier mobility in the range from 120 to 600 $cm^2$/Vs on a glass substrate easily. Techniques for CW lateral crystallization are described in A. Hara, et al., AM-LCD '01, p. 227, 2001 and F. Takeuchi, et al., AM-LCD '01, p. 251, 2001.

The embodiments of the invention are characterized in that a plurality of TFT's associated with respective pixels are collectively provided in a predetermined region and in that the a-Si layer in that region is polycrystallized using the CW lateral crystallization method. In order to improve the throughput of crystallization by reducing the scanning distance of continuously oscillated laser light, pixel TFT's are concentrated in a region as in first through sixth embodiments to be described below. In any of the embodiments, a region where TFT's are provided is optimized to reduce the scanning distance of laser light according to the CW lateral crystallization method.

Flat panel displays according to the invention and methods for manufacturing the same will now be specifically described with reference to embodiments of the same.

[First Embodiment]

Figure 2:
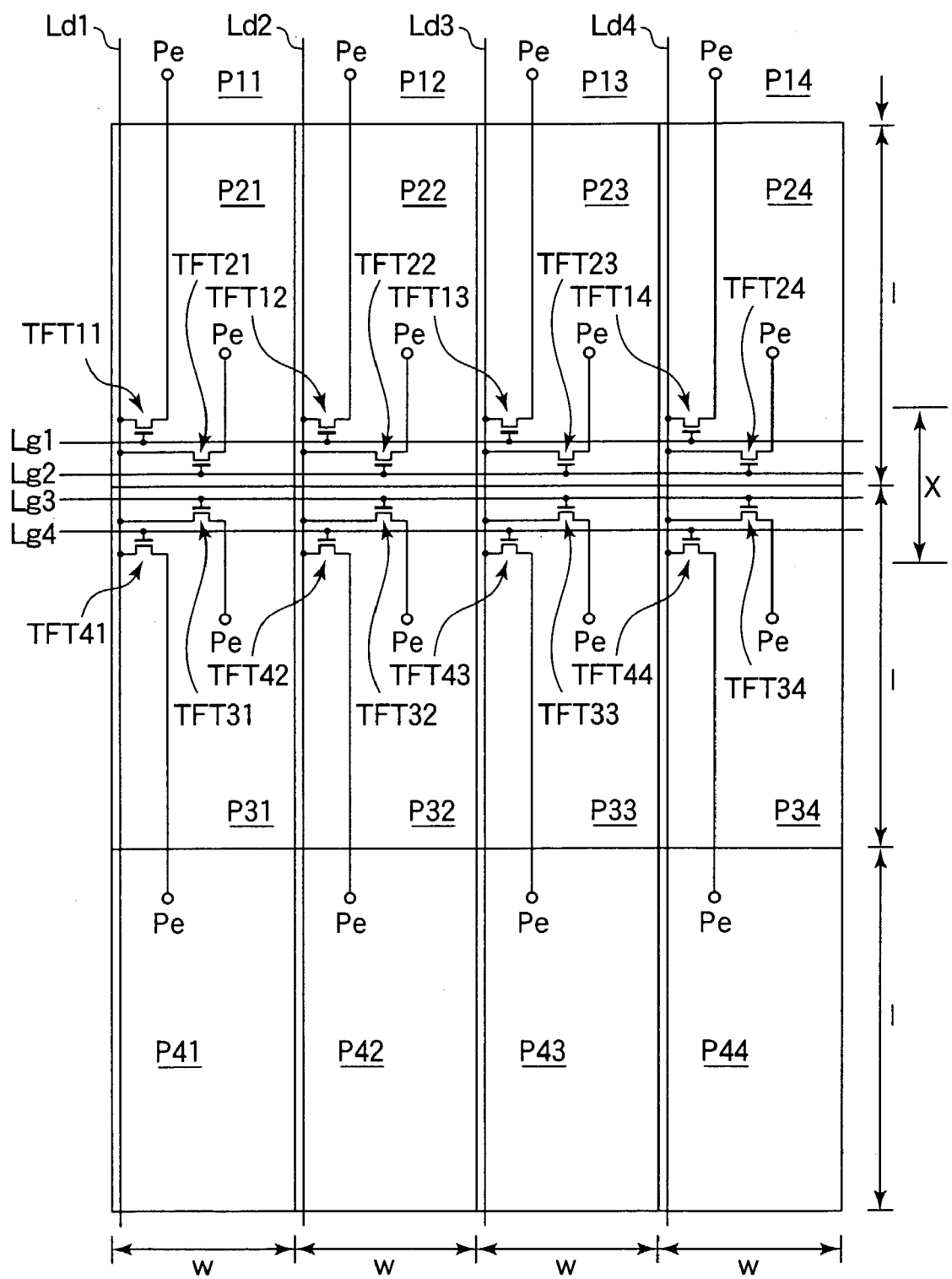
FIG. 2 shows a configuration of a first embodiment of a flat panel display according to the invention and a method of manufacturing the same.

In the present embodiment, an LCD is used as a flat panel display. A configuration of the LCD of the present embodiment and a method of manufacturing the same will be described with reference to FIGS. 2 and 3. FIG. 2 shows an equivalent circuit of 16 pixels P11 to P44 that are adjacent to each other among a plurality of pixels Pmn provided in the form of a matrix having m rows and n columns on a TFT substrate (array substrate) constituted by an insulated substrate. A pixel electrode Pe is formed at each pixel Pmn. A liquid crystal is sandwiched between each pixel electrode Pe and a common electrode formed on an opposite substrate which is not shown, thereby forming a liquid crystal capacitor. The region of each pixel Pmn is defined as a rectangle having a length l in the longitudinal direction and a width w in the lateral direction (l>w), for example.

Although not shown, in a peripheral region of the substrate adjacent to the region of the TFT substrate where the TFT's are formed, a peripheral circuit is formed integrally with the region formed with pixels using a low-temperature polysilicon manufacturing process, for example. As a part of the peripheral circuit, a gate bus line driving circuit and a data bus line driving circuit (both of which are not shown) are formed. A plurality of gate bus lines Lg1, Lg2, Lg3, . . . are extracted from the gate bus line driving circuit (not shown) and are laid such that they extend in parallel with each other in the horizontal direction in FIG. 2. A plurality of data bus lines Ld1, Ld2, Ld3, . . . are extracted from the data bus line driving circuit (not shown) and are laid such that they extend in parallel with each other in the vertical direction in FIG. 2 and such that they cross the gate bus lines Lg with an insulation film interposed.

As shown in FIG. 2, the four gate bus lines Lg1 to Lg4 are concentrated in the vicinity of a range X indicated by the vertical arrow on the right side of FIG. 2. The range X resides in the vicinity of the boundary between pixels P2n (pixels in the second row) and pixels P3n (pixels in the third row) and substantially equally extends across the two groups of pixels.

TFT's 11 to 44 connected to any of the four gate bus lines Lg1 to Lg4 are formed in the range X. TFT's mn are used as switching elements for the pixels Pmn. For example, the pixel electrodes Pe of the pixels P11, P21, P31, and P41 in the first column in the vertical direction of FIG. 2 are connected to source electrodes of the TFT's 11, 21, 31, and 41, respectively.

Drain electrodes of the TFT's 11, 21, 31, and 41 are connected to the data bus line Ld1. A gate electrode of the TFT 11 is connected to the gate bus line Lg1; a gate electrode of the TFT 21 is connected to the gate bus line Lg2; agate electrode of the TFT 31 is connected to the gate bus line Lg3; and a gate electrode of the TFT 41 is connected to the gate bus line Lg4.

Although not shown, four each of the plurality of gate bus lines Lgm and TFT's mn are combined into a set in the order of the row numbers in the above-described manner, and at least the TFT's mn are concentrated in respective ranges X that extend substantially in the middle of respective groups P of pixels each consisting of four rows.

Figure 3:
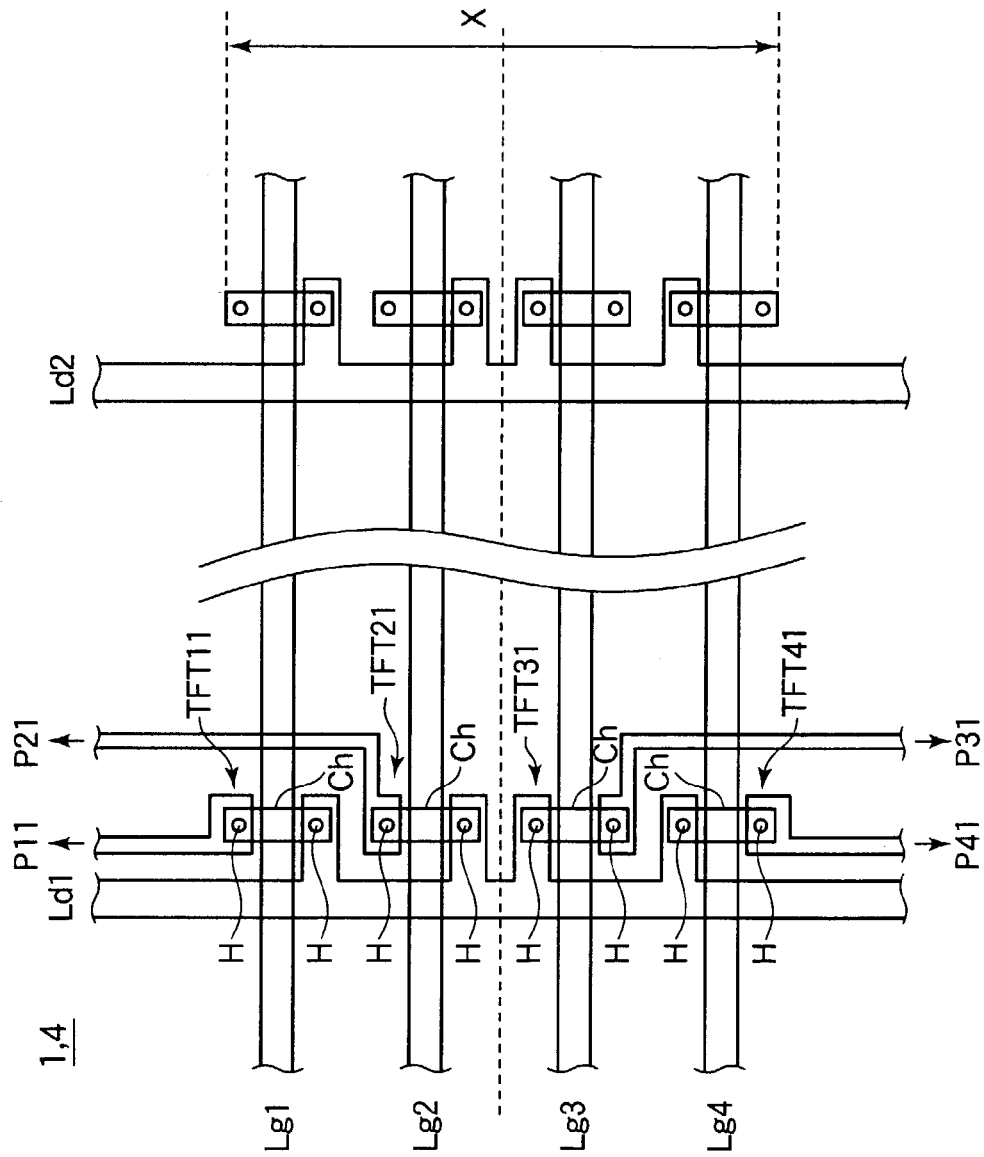
FIG. 3 shows the configuration of the first embodiment of a flat panel display according to the invention and the method of manufacturing the same.

FIG. 3 shows a pattern layout of the TFT's 11 to 41 formed in the vicinity of positions where the data bus line Ld1 and the gate bus lines Lg1 to Lg4 intersect based on the equivalent circuit in FIG. 2. In FIG. 3, elements that are the same as the elements shown in FIGS. 1 and 2 are indicated by like reference numerals. A method of manufacturing an LCD according to the present embodiment will now be described using FIG. 3 with reference to FIGS. 1 and 2.

First, for example, a silicon oxide film 4 having a thickness of 400 nm is formed on a glass substrate 1 having a thickness of 0.7 mm using plasma CVD (PE-CVD). Then, an a-Si layer having a thickness of 100 nm is deposited on the entire surface of the same. Next, the CW lateral crystallization method shown in FIG. 1 is used to irradiate the same with laser light, thereby changing an a-Si layer 6 in a region to be crystallized in which regions including channel regions are concentrated into a p-Si layer 12.

The predetermined region to be polycrystallized is a region whose width is the range X shown in FIGS. 2 and 3 and which extends in the horizontal direction in FIGS. 2 and 3. Therefore, a minimum region to be crystallized including the region where TFT's are to be formed shown in FIGS. 2 and 3 is polycrystallized by scanning the X-Y stage relative in the horizontal direction in FIGS. 2 and 3 relative to the laser light to irradiate the a-Si layer 6 in the range X with the laser light, the irradiating width of the laser light being the width of the range X.

The X-Y stage (not shown) can be operated on a step-and-repeat basis to sequentially apply laser light to polycrystallize the a-Si layers 6 in a plurality of regions where TFT's mn are to be formed concentrated in ranges X extending substantially in the middle of respective groups of pixels each consisting of four rows that are grouped into one set in the order of row numbers.

The laser power is 4 W, for example. The optical system in FIG. 1 is a combination of two cylindrical lenses which is adjusted such that a linear beam spot is formed on its projection plane. The relative scanning speed between the laser light and X-Y stage is 2 m/sec. The range X that is the crystallizing width is 50 µm in the present embodiment. TFT's in such a range X had mobility of 120 cm$^2$/Vs that is required for a pixel TFT.

Let us assume that one pixel has a pixel size of 150 square µm and that the pixels Pmn are sub-pixels associated with the three primary colors of light R (red), G (green), and B (blue). Then, the pixels Pmn are rectangles having a length l of 150 µm and a width w of 50 µm. In the present embodiment, regions where TFT's are to be formed are concentrated in parallel with the shorter sides of the pixels Pmn to perform selective polycrystallization. Since this makes it possible to concentrate a greater number of TFT's within a shorter range than that in the case of selective polycrystallization in which regions where TFT's are to be formed are concentrated in parallel with the longer sides of the rectangular pixels P mn, the throughput of crystallization can be improved.

When the a-Si layer 6 is thus polycrystallized in predetermined regions to form a p-Si layer 12, the p-Si layer 12 is patterned into islands as shown in FIG. 3, and a channel region Ch and source and drain regions of each TFT mn are formed. Next, the p-Si layer is doped with impurity ions to provide a predetermined conductivity type and is then annealed. A silicon oxide film is then formed using plasma CVD or the like to form a gate insulation film. A gate forming metal layer is then formed and patterned using sputtering or the like to form gate bus lines Lgm that also serve as gate electrodes. The p-Si layer 12 is then doped with impurity ions of the conductivity type opposite to that described above using the gate bus lines Lgm as a mask and then annealed, thereby forming source and drain regions of a predetermined conductivity type on a self-alignment basis. Thereafter, a layer insulation film is formed of SiN film or the like using plasma CVD method or the like. Next, contact holes H are formed in the layer insulation film above the source and drain regions. A film of a material for forming source and drain electrodes is then formed and patterned on the layer insulation film to form data bus lines Ldn that are connected to the drain regions through the contact holes H, and source electrodes connected to the source regions through the contact holes H are simultaneously formed. The above steps complete a substrate for an active matrix type display having TFT's mn formed thereon as shown in FIG. 3. Thereafter, it is combined with an opposite substrate, and a liquid crystal is sealed between those substrates to compete a liquid crystal display.

In a layout of TFT's in an LCD in the related art shown in FIG. 4 that is a comparative example to be described later, a range X to serve as a polycrystallizing width must be provided for each pixel, and laser irradiation for CW lateral crystallization must be performed at intervals of 150 µm. On the contrary, in the present embodiment, pixel TFT's are concentrated such that continuously oscillated laser light can be efficiently scanned, and the a-Si layer is polycrystallized using the CW lateral polycrystallization method in regions where the TFT's are thus concentrated. This required the scanning of laser light to be performed at a rate of once per four pixel rows (at a scanning interval of 600 µm). Since the scanning distance of laser light is thus shorter in the CW lateral polycrystallization method, the throughput of polycrystallization can be improved.

While laser light is scanned at a rate of once per four pixel rows in the present embodiment, this is not limiting the invention, and laser light may be scanned at a rate of once per two pixel rows (at a scanning interval of 300 µm) or once per three pixel rows (at a scanning interval of 450 µm). Alternatively, laser light may be scanned at a rate of once per eight pixel rows (at a scanning interval of 1200 µm) to increase the scanning interval, which makes it possible to increase the number of pixels that are polycrystallized at one scan of laser light substantially and to thereby improve the throughput of polycrystallization further.

In the case of a transmission type LCD in which all pixels have the same size and an organic EL display from which light is extracted on the glass substrate side and in which all pixels have the same size, the pixels will have different effective display areas depending on whether they overlap a range X or not. Therefore, such displays will have pixels with different aperture ratios or emission areas. When irregularities of display occur for this reason, the sizes of the pixels may be changed to provide the same aperture ratio and emission area. On the contrary, in the case of a reflection type LCD and an organic EL display having a configuration from which light is extracted from the side opposite to the glass substrate, since the TFT's and bus lines are hidden behind the pixel electrodes, there will be no difference in the effective display area between pixels that overlap a range X and pixels that do not overlap.

While the present embodiment has been described with reference to a glass substrate as an example, substrates to which the present embodiment may be applied are not limited to glass substrates. The present embodiment may be applied to flat panels utilizing transparent substrates made of plastic and quartz substrates. Obviously, the present embodiment may be applied to flat panel displays utilizing an opaque substrate such as a silicon substrate or a metal substrate, e.g., an aluminum substrate or steel substrate used for a reflection type LCD and an organic EL display having a configuration in which light is extracted from the side opposite to the glass substrate.

[First Comparative Example]

Figure 4:
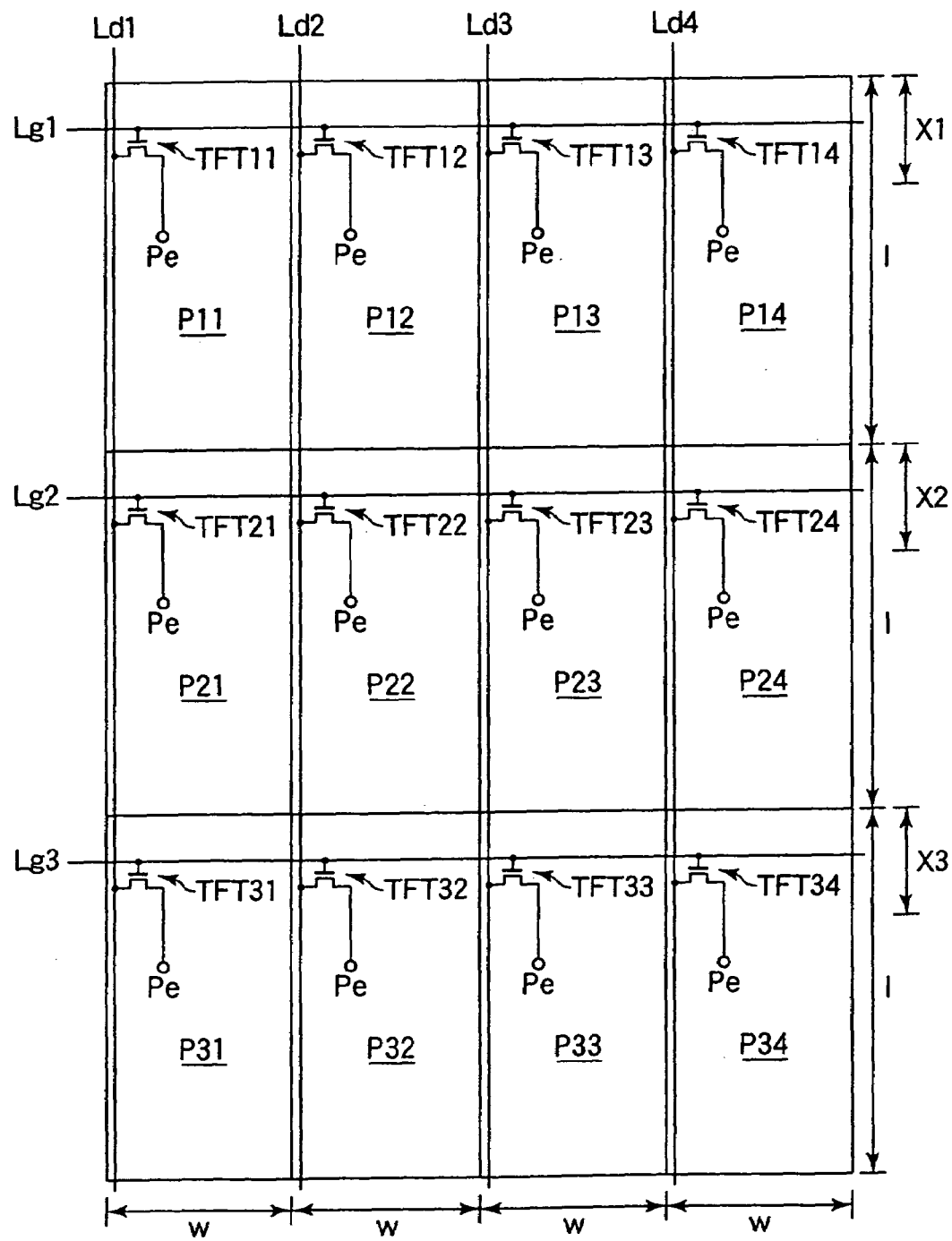
FIG. 4 shows a configuration of a flat panel display in the related art as a first comparative example.

FIG. 4 shows an equivalent circuit of a TFT substrate of an LCD in the related art as a comparative example for the first embodiment. FIG. 4 shows 16 pixels P11 to P44 that are adjacent to each other among a plurality of pixels Pmn provided in the form of a matrix having m rows and n columns on a TFT substrate constituted by an insulated substrate. A pixel electrode Pe is formed at each pixel Pmn. A liquid crystal is sandwiched between each pixel electrode Pe and a common electrode formed on an opposite substrate which is not shown, thereby forming a liquid crystal capacitor. The region of each pixel Pmn is defined as a rectangle having a length l (e.g., 150 μm) in the longitudinal direction and a width w (e.g., 50 μm) in the lateral direction.

A plurality of gate bus lines Lg1, Lg2, Lg3, . . . are extracted from a gate bus line driving circuit (not shown) and are laid such that they extend in parallel with each other in the horizontal direction in FIG. 4. A plurality of data bus lines Ld1, Ld2, Ld3, . . . are extracted from a data bus line driving circuit (not shown) and are laid such that they extend in parallel with each other in the vertical direction in FIG. 4 and such that they cross the gate bus lines Lg with an insulation film interposed.

As shown in FIG. 4, regions defined by the gate bus lines Lgm and the data bus lines Ldn serve as pixel regions. TFT's mn of the pixels Pmn are formed in the vicinity of the regions where the gate bus line Lgm and the data bus line Ldn intersect.

In this TFT layout in the related art, a range X to serve as a polycrystallizing width used for CW lateral crystallization must be provided for each pixel, and it is therefore required to perform laser irradiation for CW lateral crystallization at intervals of at least 150 μm.

[Second Embodiment]

Figure 5:
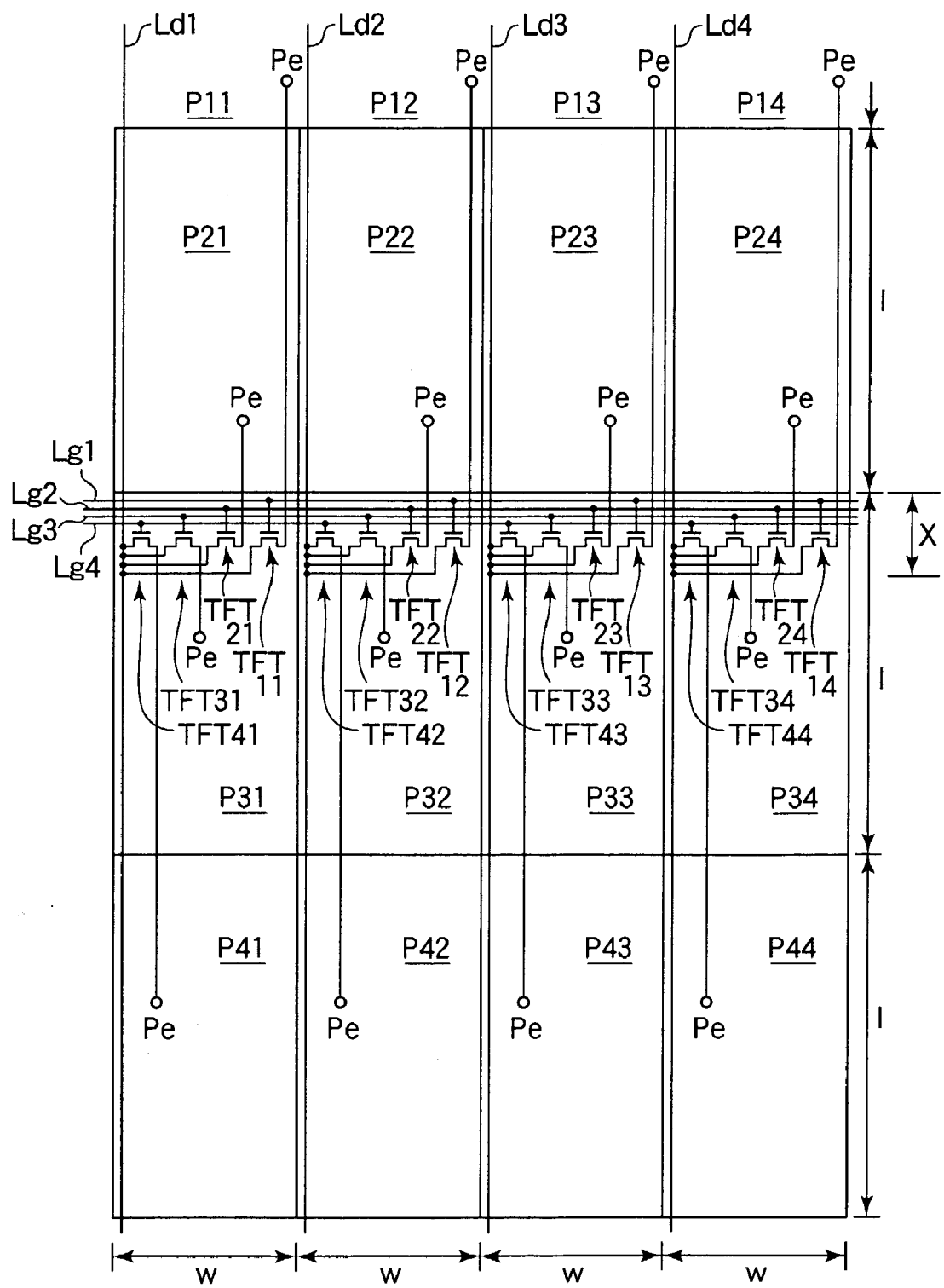
FIG. 5 shows a configuration of a second embodiment of a flat panel display according to the invention.
Figure 6:
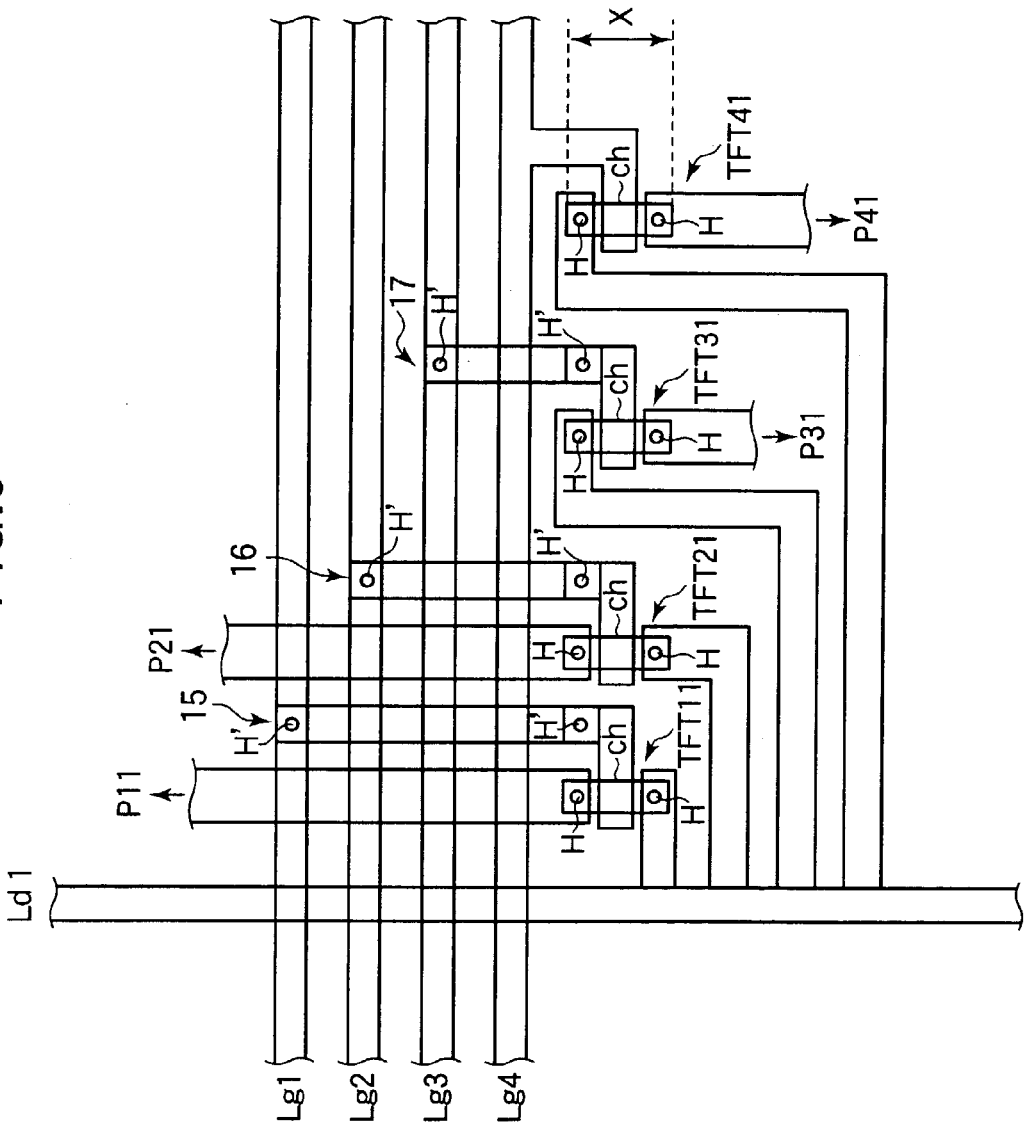
FIG. 6 shows the configuration of the second embodiment of a flat panel display according to the invention.

An LCD is used as a flat panel display also in the present embodiment. A configuration of the LCD of the present embodiment will be described with reference to FIGS. 5 and 6. FIG. 5 shows an equivalent circuit of 16 pixels P11 to P44 that are adjacent to each other among a plurality of pixels Pmn provided in the form of a matrix having m rows and n columns on a TFT substrate constituted by an insulated substrate. A pixel electrode Pe is formed at each pixel Pmn. A liquid crystal is sandwiched between each pixel electrode Pe and a common electrode formed on an opposite substrate which is not shown, thereby forming a liquid crystal capacitor. The region of each pixel Pmn is defined as a rectangle having a length l in the longitudinal direction and a width w in the lateral direction (l>w), for example. FIG. 6 shows a pattern layout of the TFT's 11 to 41 formed in the vicinity of positions where a data bus line Ld1 and gate bus lines Lg1 to Lg4 intersect based on the equivalent circuit in FIG. 5. In FIGS. 5 and 6, elements that are the same as the elements shown in FIGS. 1 to 3 are indicated by like reference numerals and will not be described.

In the LCD of the present embodiment, just as in the first embodiment, the four gate bus lines Lg1 to Lg4 are concentrated in the vicinity of a range X indicated by the vertical arrow on the right side of FIGS. 5 and 6. Similarly, four each of the rest of the plurality of gate bus lines Lgm and the TFT's mn are collected into one set in the order of row numbers, and at least the TFT's mn are concentrated in respective ranges X that extend substantially in the middle of respective groups of pixels each consisting of four rows.

The present embodiment is different from the first embodiment in that a set of four TFT's (e.g., the TFTs 11, 21, 31, and 41 in the region shown in FIGS. 5 and 6) are arranged in a row along a gate bus lines Lg within the width w. In the present embodiment, as shown in FIG. 6, the gate bus lines Lg and the gate electrodes of TFT's associated with the same are respectively connected with connection lines 15, 16, and 17 through contact holes H' formed in a layer insulation film that is not shown to provide the plurality of TFT's in a row along the gate bus lines Lg. As a result, in the region shown in FIGS. 5 and 6, the range X resides only in the pixels P3n (the pixels in the third row), and the crystallizing width can therefore be one half or less of the range X in the first embodiment. The reduction in the range X makes it possible to perform polycrystallization with a laser output having lower power. It is therefore possible to improve the throughput of polycrystallization in a modification of the configuration shown in FIG. 1 in which a substrate can be simultaneously irradiated with split laser beams.

[Third Embodiment]

Figure 7:
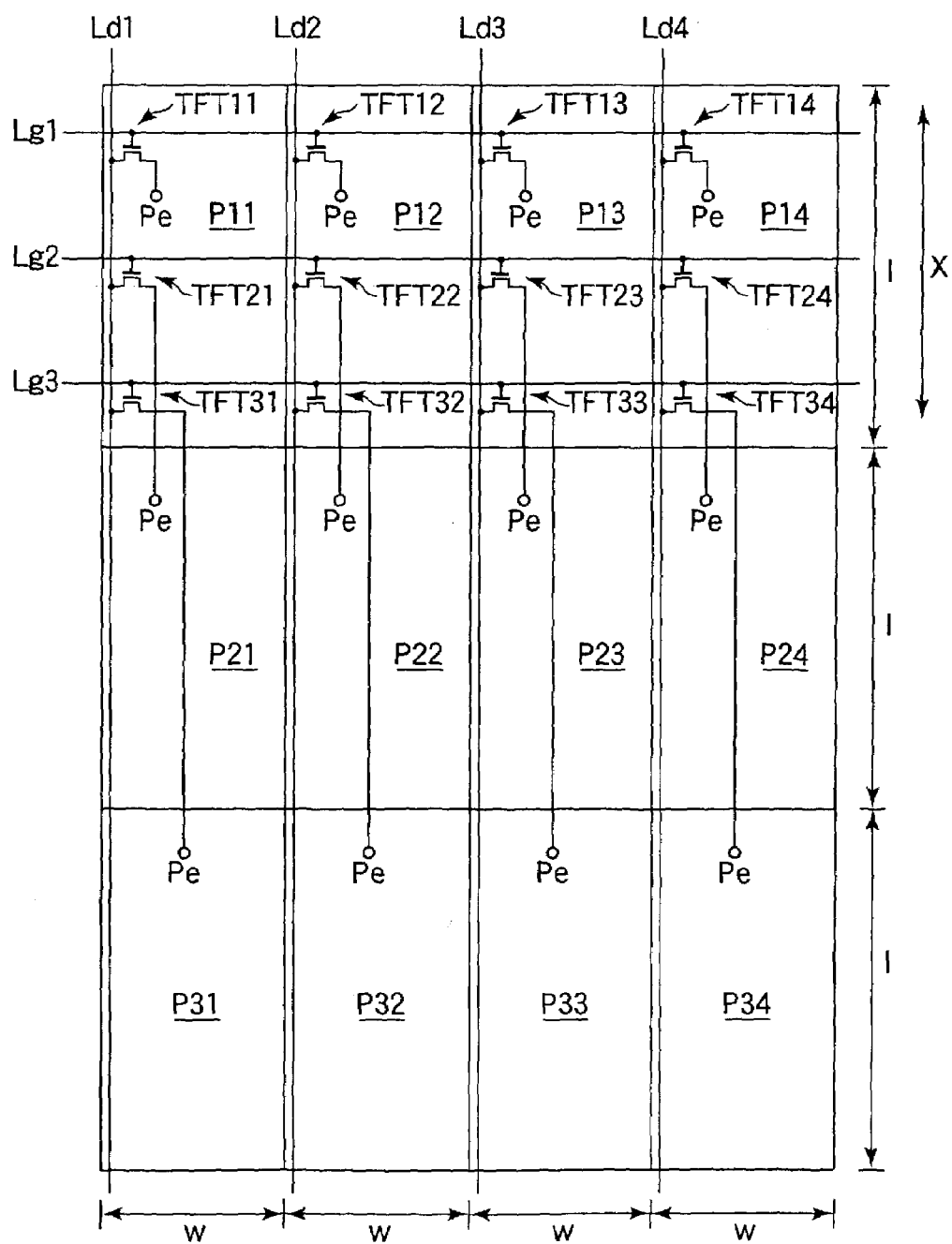
FIG. 7 shows a configuration of a third embodiment of a flat panel display according to the invention.
Figure 8:
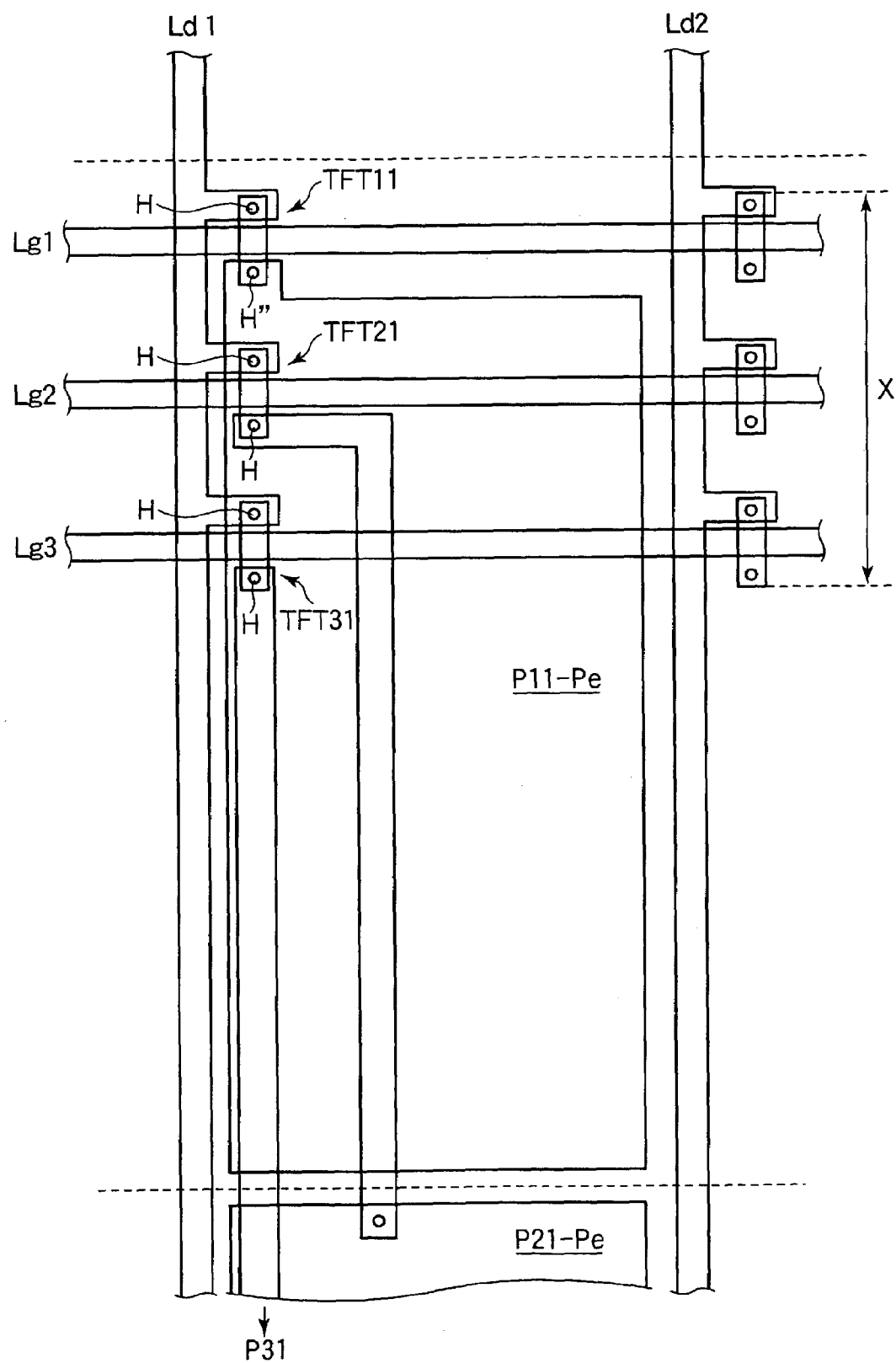
FIG. 8 shows the configuration of the third embodiment of a flat panel display according to the invention.

An LCD is used as a flat panel display also in the present embodiment. A configuration of the LCD of the present embodiment will be described with reference to FIGS. 7 and 8. FIG. 7 shows an equivalent circuit of 12 pixels P11 to P34 that are adjacent to each other among a plurality of pixels Pmn provided in the form of a matrix having m rows and n columns on a TFT substrate constituted by an insulated substrate. FIG. 8 shows a pattern layout of the TFT's 11 to 31 formed in the vicinity of positions where a data bus line Ld1 and gate bus lines Lg1 to Lg3 intersect based on the equivalent circuit in FIG. 7. In FIGS. 7 and 8, elements that are the same as the elements shown in FIGS. 1 to 6 are indicated by like reference numerals and will not be described.

In the LCD of the present embodiment, the three gate bus lines Lg1 to Lg3 are concentrated in the vicinity of a range X indicated by the vertical arrow on the right side of FIGS. 7 and 8. Similarly, three each of the rest of the plurality of gate bus lines Lgm and the TFT's mn are collected into one set in the order of row numbers, and at least the TFT's mn are concentrated in respective ranges X that extend through the pixels P having the smallest row numbers in the respective groups of pixels each consisting of three rows. In the present embodiment, TFT's for a plurality of pixels are concentrated in a row within one pixel along the data bus lines Ld. The present embodiment also makes it possible to improve the throughput of crystallization like the first embodiment.

[Fourth Embodiment]

An LCD is used as a flat panel display also in the present embodiment. A configuration of the LCD of the present embodiment will be described with reference to FIG. 9. FIG.

Figure 9:
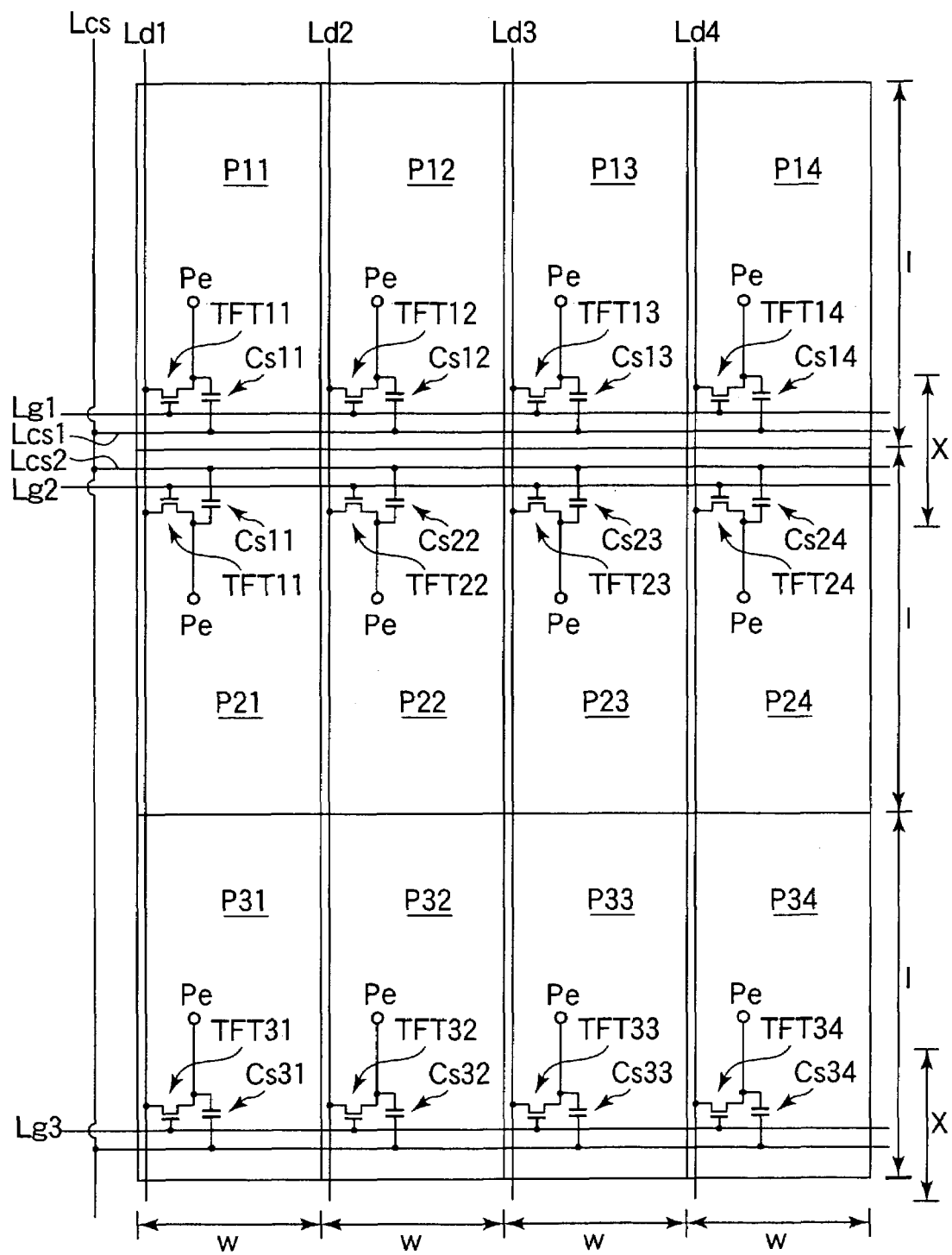
FIG. 9 shows a configuration of a fourth embodiment of a flat panel display according to the invention.

9 shows an equivalent circuit of 12 pixels P11 to P34 that are adjacent to each other among a plurality of pixels Pmn provided in the form of a matrix having m rows and n columns on a TFT substrate constituted by an insulated substrate. In FIG. 9, elements that are the same as the elements shown in FIGS. 1 to 8 are indicated by like reference numerals and will not be described.

In LCD's in general, a liquid crystal capacitor is formed by sandwiching a liquid crystal between a pixel electrode Pe of each pixel Pmn and an opposite electrode that is not shown, and a storage capacitor is connected in parallel with the liquid crystal capacitor in order to prolong the damping time of charges in the liquid crystal capacitor. FIG. 9 shows a pixel structure having a so-called independent structure type storage capacitor.

As shown in FIG. 9, two gate bus lines Lg1 and Lg2 are concentrated in the vicinity of a range X indicated by the vertical arrow on the right side of FIG. 9. The range X resides in the vicinity of the boundary between pixels P1$n$ (pixels in the first row) and pixels P2$n$ (pixels in the second row) and substantially equally extends across the two groups of pixels.

TFT's 11 to 24 connected to either of the two gate bus lines Lg1 and Lg2 are formed in the range X. For example, the pixel electrodes Pe of the pixels P11 and P21 in the first column in the vertical direction of FIG. 9 are connected to source electrodes of the TFT's 11 and 21, respectively.

Drain electrodes of the TFT's 11 and 21 are connected to the data bus line Ld1. A gate electrode of the TFT 11 is connected to the gate bus line Lg1, and a gate electrode of the TFT 21 is connected to the gate bus line Lg2.

Although not shown, two each of the plurality of gate bus lines Lgm and TFT's mn are combined into a set in the order of the row numbers in the above-described manner, and at least the TFT's mn are concentrated in respective ranges X that extend substantially in the middle of respective groups of pixels Pmn each consisting of two rows.

Storage capacitor bus lines Lcs1 and Lcs2 that face the pixel electrodes Pe of respective pixels Pmn with an insulation film interposed to form storage capacitors are also collectively laid in the range X. The storage capacitor bus line Lcs1 cooperates with the pixel electrode Pe of each pixel P1$n$ provided in the first row through the insulation film to form a storage capacitor for the pixel. The storage capacitor bus line Lcs2 cooperates with the pixel electrode Pe of each pixel P2$n$ provided in the second row through the insulation film to form a storage capacitor for the pixel.

Although not shown, two each of storage capacitor bus lines Lcsm are combined into a set in the above-described manner and concentrated in respective ranges X that extend substantially in the middle of respective groups of pixels Pmn each consisting of two rows. A silicon layer directly below storage capacitor bus lines Lcs can be polycrystallized by forming the storage capacitor bus lines along a range X in such a manner.

While laser light is scanned at a rate of once per two pixel rows (at a scanning interval of 300 μm) in the present embodiment, this is not limiting the invention, and laser light may be scanned at a rate of once per three pixel rows (at a scanning interval of 450 μm) or more to increase the scanning interval, which makes it possible to increase the number of pixels that are polycrystallized at one scan of laser light substantially and to thereby improve the throughput of polycrystallization further.

[Second Comparative Example]

Figure 10:
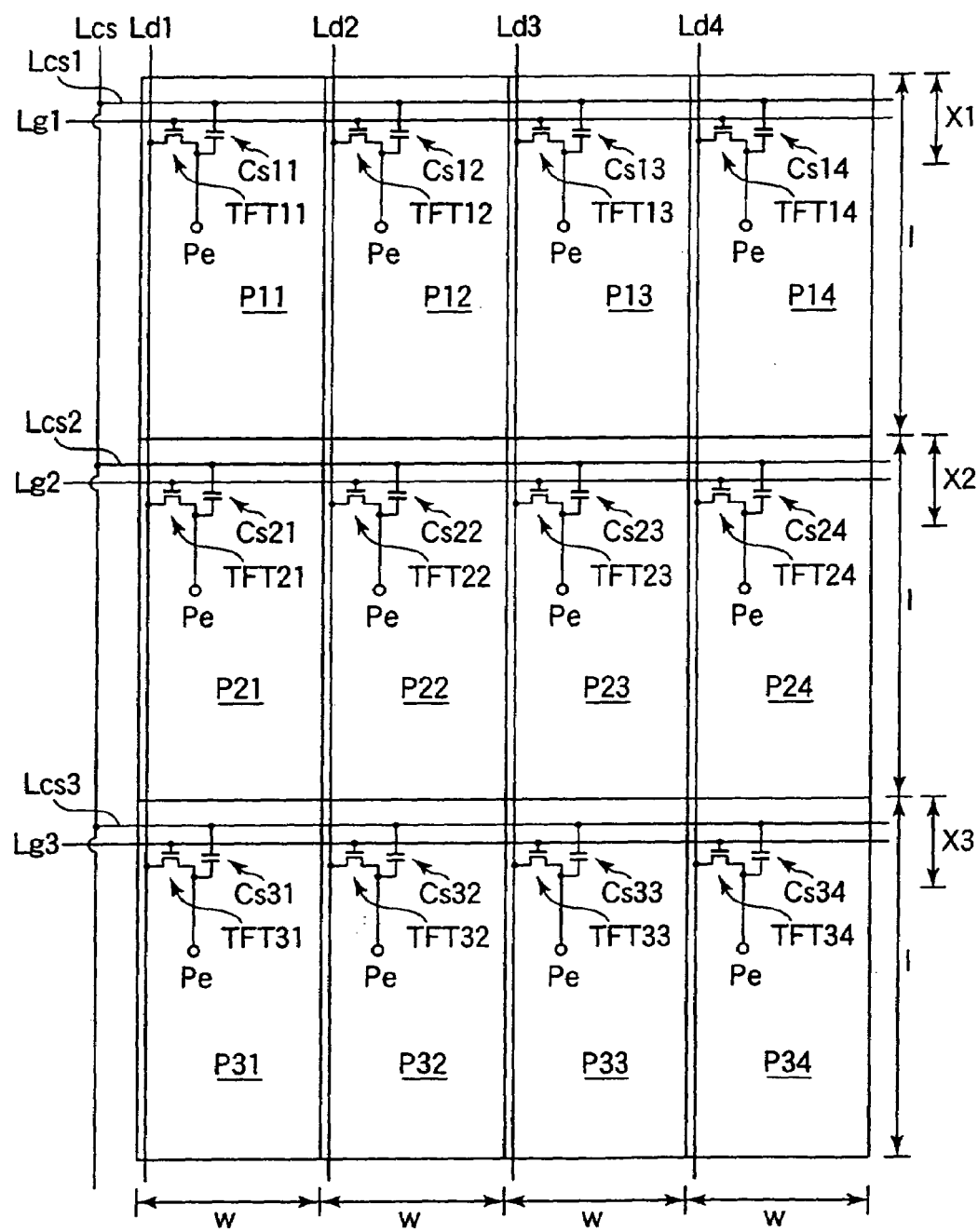
FIG. 10 shows a configuration of a flat panel display in the related art as a second comparative example.

FIG. 10 shows an equivalent circuit of a TFT substrate of an LCD in the related art as a comparative example for the fourth embodiment. FIG. 10 is similar to the equivalent circuit shown in FIG. 4 except that storage capacitor bus lines Lcs are added. A plurality of gate bus lines Lg1, Lg2, Lg3, . . . extending in parallel with each other in the horizontal direction of FIG. 4 are extracted and laid. Storage capacitor bus lines Lcs1, Lcs2, Lcs3, . . . are formed adjacent to the gate bus lines Lg1, Lg2, Lg3, . . . , respectively. In this LCD in the related art, a range X to serve as a polycrystallizing width used for CW lateral crystallization must be provided for each pixel, and it is therefore required to perform laser irradiation for CW lateral crystallization at a scanning interval that is at least equivalent to a longer side 1 of a rectangular pixel P, which disallows improvement of the throughput of polycrystallization.

[Fifth Embodiment]

Figure 11:
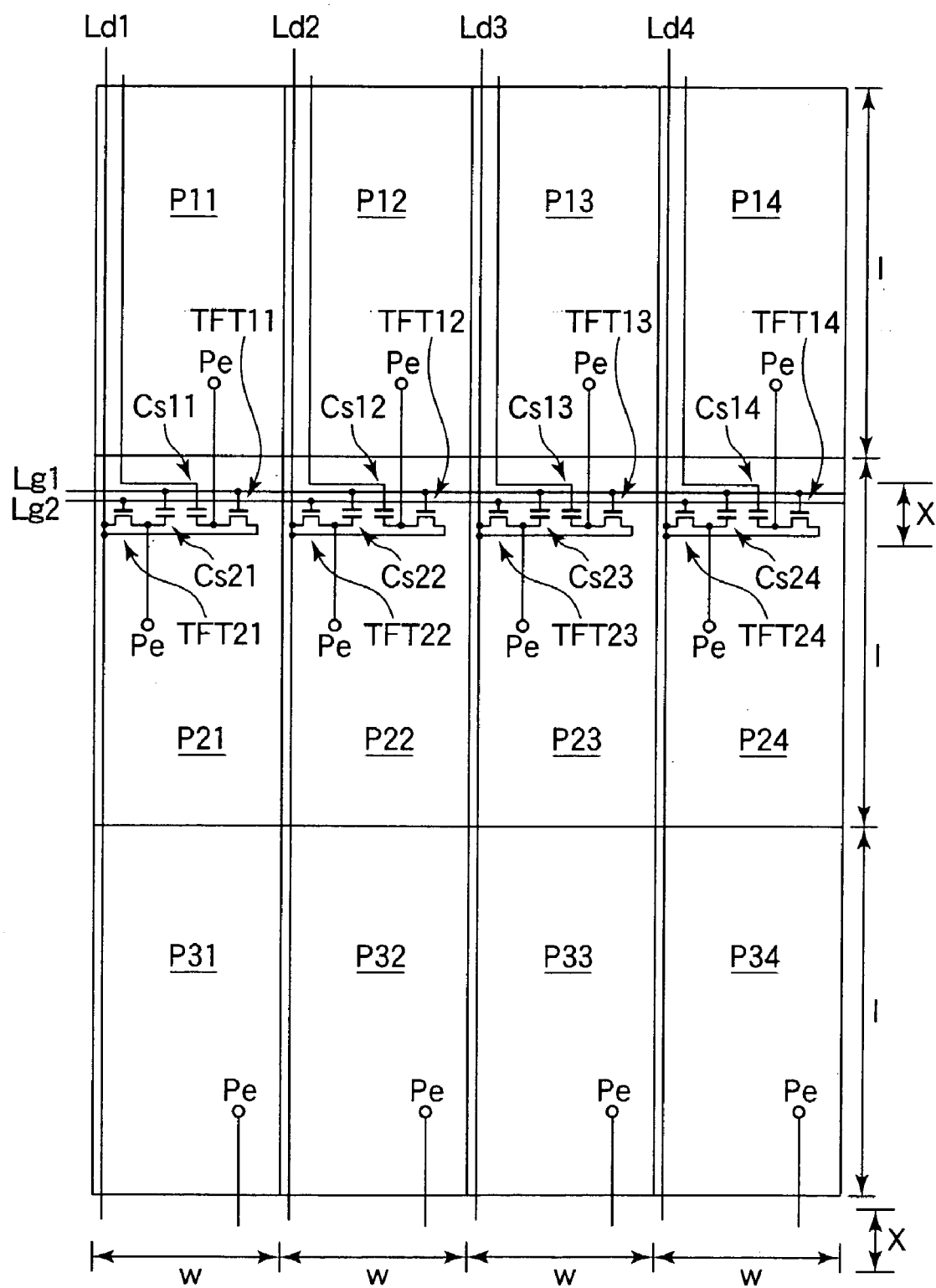
FIG. 11 shows a configuration of a fifth embodiment of a flat panel display according to the invention.

An LCD is used as a flat panel display also in the present embodiment. A configuration of the LCD of the present embodiment will be described with reference to FIG. 11. FIG. 11 shows an LCD having a so-called CS-on-Gate structure in which an upstream gate bus line lg is used as a storage capacitor.

In the LCD of the present embodiment, just as in the fourth embodiment, two gate bus lines Lg1 and Lg2 and TFT's connected thereto are concentrated in the vicinity of a range X indicated by the vertical arrow on the right side of FIG. 11. Similarly, two each of the rest of a plurality of gate bus lines Lgm and TFT's mn are collected into one set in the order of row numbers and concentrated in respective ranges X that extend substantially in the middle of respective groups of pixels each consisting of two rows.

The present embodiment is different from the fourth embodiment in that an upstream gate bus line Lg is used as a storage capacitor bus line instead of providing an independent storage capacitor bus line and in that a set of two TFT's (e.g., the TFTs 11 and 21 in FIG. 11) are arranged in a row along a gate bus lines Lg within the width w. As a result, the range X resides only in the pixels P2$n$ (the pixels in the second row), and the crystallizing width can therefore be one half or less of the range X in the fourth embodiment. The reduction in the range X makes it possible to perform polycrystallization with a laser output having lower power. It is therefore possible to improve the throughput of polycrystallization in a modification of the configuration shown in FIG. 4 in which a substrate can be simultaneously irradiated with split laser beams.

[Third Comparative Example]

Figure 12:
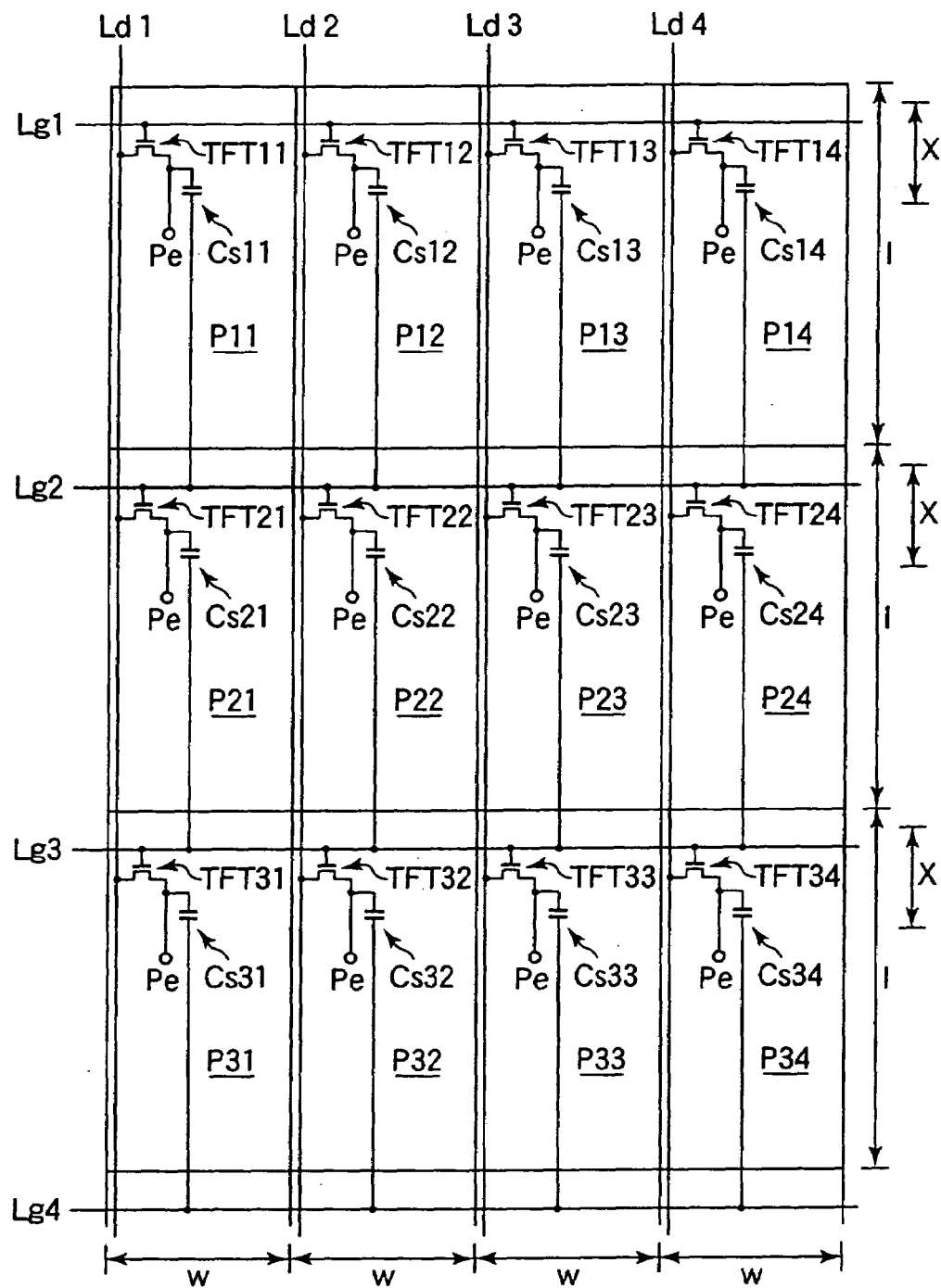
FIG. 12 shows a configuration of a flat panel display in the related art as a third comparative example.

FIG. 12 shows an equivalent circuit of a TFT substrate of an LCD in the related art as a comparative example for the fifth embodiment. FIG. 12 is similar to the equivalent circuit shown in FIG. 10 except that a downstream gate bus line Lg is used as a storage capacitor bus line instead of an independent storage capacitor bus line. A plurality of gate bus lines Lg1, Lg2, Lg3, . . . extending in parallel with each other in the horizontal direction of FIG. 12 are extracted and laid. The pixel electrode Pe of each pixel P forms a storage capacitor in combination with a gate bus line Lg downstream thereof. In this LCD in the related art, a range X to serve as a polycrystallizing width used for CW lateral crystallization must be provided for each pixel. It is therefore required to perform laser irradiation for CW lateral crystallization at a scanning interval that is at least equivalent to a longer side 1 of a rectangular pixel P, which disallows improvement of the throughput of polycrystallization.

[Sixth Embodiment]

Figure 13:
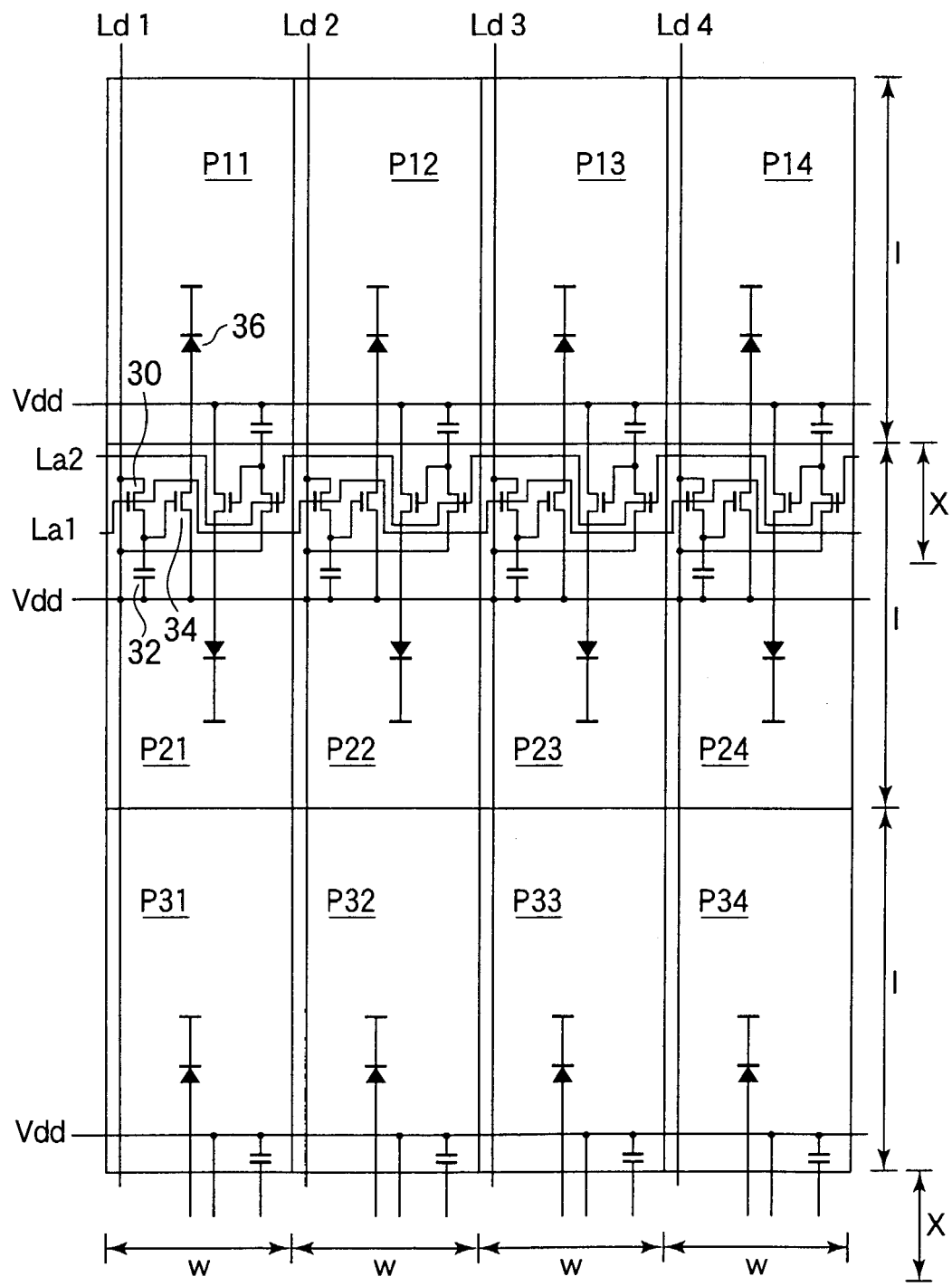
FIG. 13 shows a configuration of a sixth embodiment of a flat panel display according to the invention.

A thin film organic EL display is used as a flat panel display in the present embodiment. A configuration of the thin film organic EL display will be described with reference to FIG. 13. FIG. 13 shows an equivalent circuit of 12 pixels P11 to P34 that are adjacent to each other among a plurality of pixels Pmn provided in the form of a matrix having m rows and n columns on an insulated substrate. A plurality of data bus lines Ldn and address bus lines Lam intersecting each other with an insulation film interposed are laid on the substrate. Power supply lines Vdd are provided in parallel with the address bus lines Lam. TFT's 30 and 34 are formed at each pixel Pmn. A gate electrode of the TFT 30 is connected to an address bus line La1. Either source electrode or drain electrode of the TFT 30 is connected to a data bus line Ld1, and the other is connected to a power supply line Vdd through a capacitor 32 and to a gate electrode of the TFT 34. Either source electrode or drain electrode of the TFT 34 is connected to a power supply line, and the other is connected to the anode of a diode 36. The cathode of the diode 36 is grounded.

Referring to the pixel P11 for example, when the address bus line La1 is selected to turn on the n-channel TFT 30 for example, the capacitor 32 is charged with a potential difference between the power supply line Vdd and the data bus line Ld1. When the potential at the gate electrode of the n-channel TFT 34 is increased as a result of the charging of the capacitor 32 to turn on the TFT 34, a current flows from the power supply line Vdd to the diode 36 to cause emission.

In the thin film organic EL display of the present embodiment, the two address bus lines La1 and La2 are concentrated in a range X indicated by the vertical arrow on the right side of FIG. 13. Similarly, two each of the rest of the plurality of address bus lines Lam and the TFT's 30 and 34 are collected into one set in the order of row numbers and concentrated in respective ranges X that extend substantially in the middle of respective groups of pixels Pmn each consisting of two rows.

In the present embodiment, four TFT's 30 and 34 for two pixels are arranged in a row along the address bus lines La. As a result, in the region shown in FIG. 13, the range X resides only in the pixels P2n (the pixels in the second row), which makes it possible to perform polycrystallization with a laser output having lower power and to improve the throughput of polycrystallization.

[Fourth Comparative Example]

Figure 14:
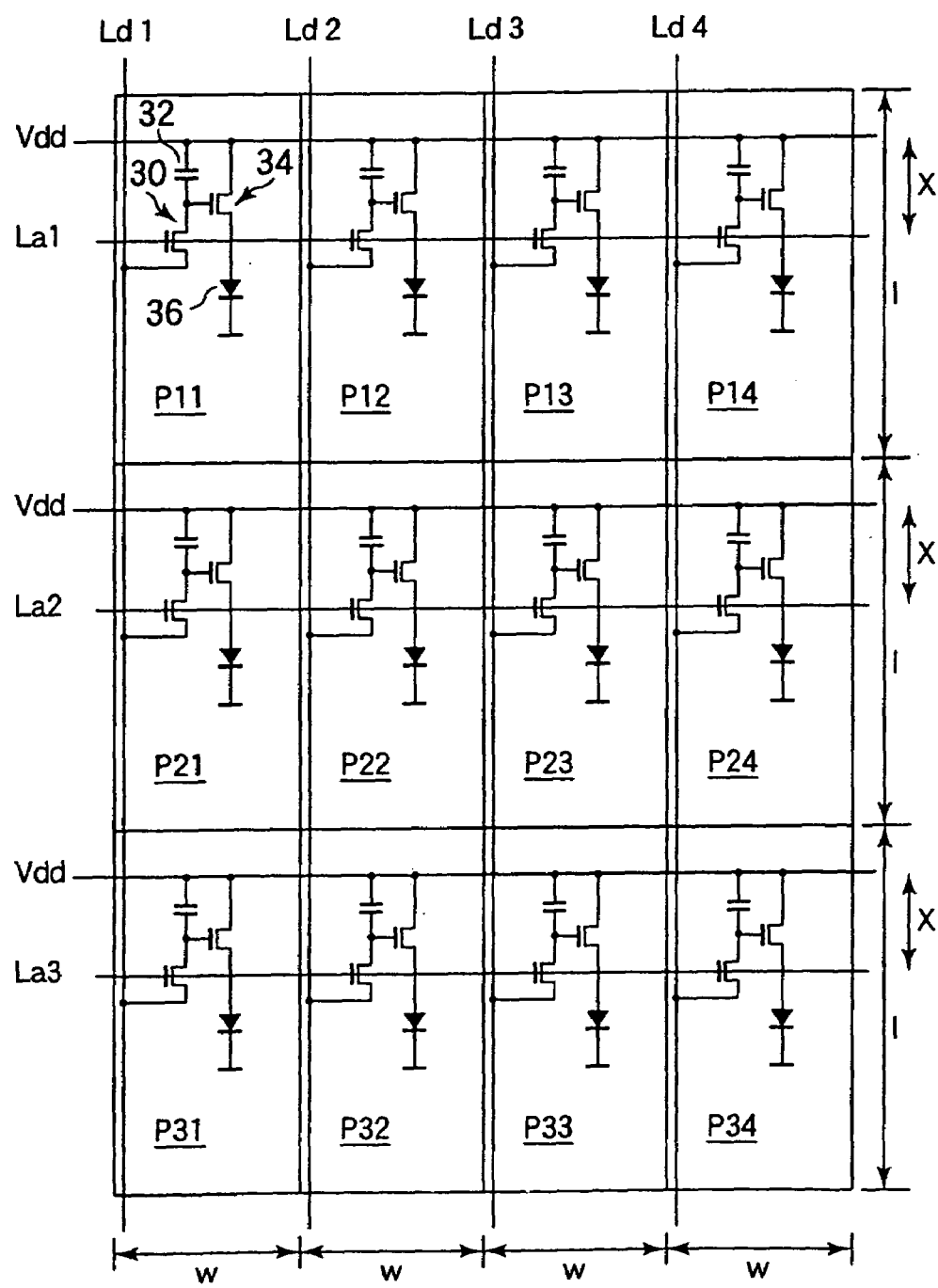
FIG. 14 shows a configuration of a flat panel display in the related art as a fourth comparative example.
Figure 15:
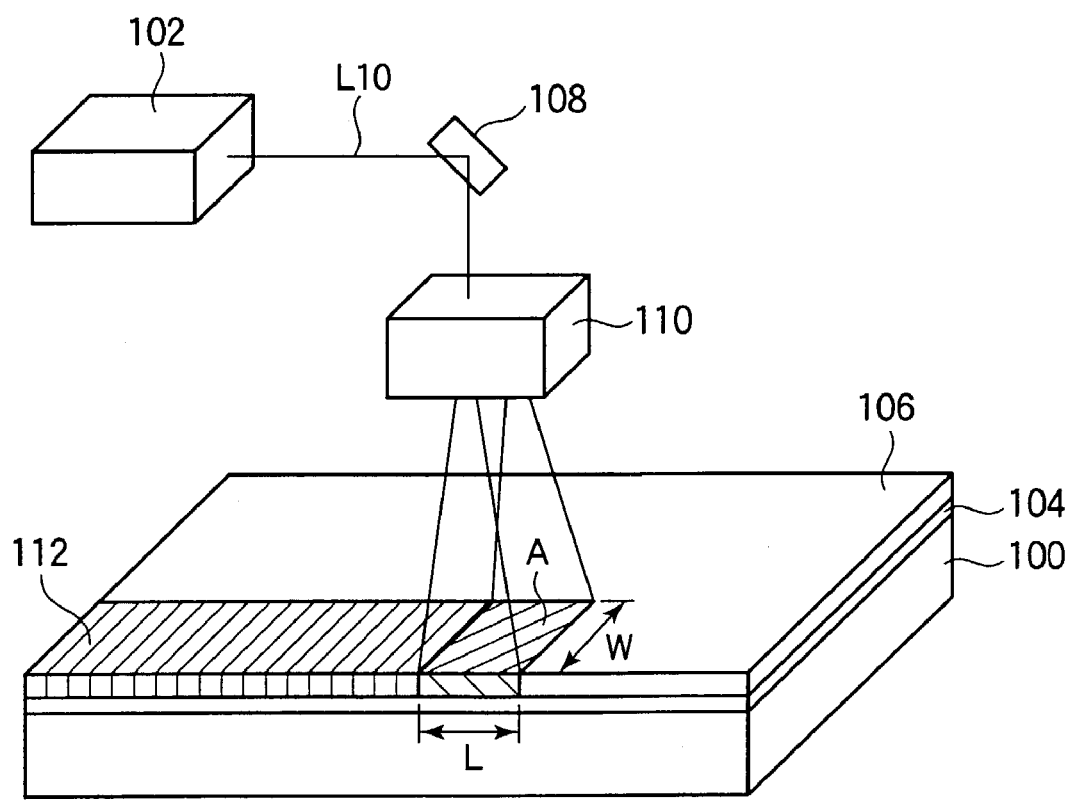
FIG. 15 illustrates the excimer laser crystallization method.

FIG. 14 shows an equivalent circuit of a thin film organic EL display in the relates art as a comparative example for the sixth embodiment. In the thin film organic EL display in the related art, a range X to serve as a polycrystallizing width for CW lateral crystallization must be provided for each pixel. It is therefore required to perform laser irradiation for CW lateral crystallization at a scanning interval that is at least equivalent to a longer side 1 of a rectangular pixel P, which disallows improvement of the throughput of polycrystallization.

As described above, in an active matrix type LCD or a thin film organic EL display utilizing p-Si TFT's, the embodiments of the invention make it possible to reduce the time required for polycrystallizing an a-Si layer using the CW lateral crystallization method, thereby allowing a reduction in manufacturing cost and allowing the formation of a pixel TFT having high carrier mobility and less variation of characteristics.

The invention is not limited to the above embodiments and may be modified in various ways. For example, the first through fifth embodiments of the invention may be applied to transmission type LCD's, reflection type LCD's or semi-transmission type LCD'S.

As described above, the invention makes it possible to improve the throughput of crystallization in forming switching elements by crystallizing a semiconductor layer formed on a substrate using the CW lateral crystallization method.

What is claimed is:

1. A flat panel display having a plurality of switching elements and pixels,
   at least one of the switching elements provided in association with each of the pixels, wherein switching elements for more than one pixel in a pixel group are concentrated in one predetermined pixel in the pixel group, such that certain pixels in the pixel group do not include any switching elements thereon.

2. A flat panel display according to claim 1, wherein each group of pixels is provided in a rectangular pixel region, respectively, and the switching elements are concentrated along a shorter side of the rectangular pixel region in the predetermined pixel in the group.

3. A flat panel display according to claim 1, wherein the switching elements in the predetermined pixel in the group are arranged in a row.

4. A flat panel display according to claim 1, further comprising a plurality of storage capacitors, each of the storage capacitors being provided corresponding to each of the pixels and wherein the storage capacitors are concentrated along with the switching elements.

5. A flat panel display according to claim 1, further comprising a liquid crystal layer between each of the pixels and an opposite substrate and a reflection type pixel electrode formed at each of the pixels, wherein each of the switching elements is provided on a back side of the light-reflecting surface of the reflection type pixel electrode.

6. A flat panel display according to claim 1, further comprising an organic EL element formed between each of the pixels and an opposite electrode, wherein each of the switching elements is provided on a side of the organic EL elements opposite to a light emitting side thereof.

7. A flat panel display having a plurality of switching elements and pixels, wherein:
   said pixels are arranged in rows and columns;
   said switching elements are arranged in rows at pixel boundaries between some rows of pixels but not between other rows of pixels; and
   said switching elements are arranged in only one row, at a pixel boundary between two rows of pixels, for every four rows of pixels.

8. A flat panel display having a plurality of switching elements and pixels, wherein:
   said pixels are arranged in rows and columns;
   said switching elements are arranged in rows at pixel boundaries between some rows of pixels but not between other rows of pixels;
   said switching elements are arranged in only one row, at a pixel boundary between two rows of pixels, for every three rows of pixels.

9. A flat panel display having a plurality of switching elements and pixels, wherein:
   said pixels are arranged in rows and columns;
   said switching elements are arranged in rows at pixel boundaries between some rows of pixels but not between other rows of pixels; and
   said switching elements are arranged in one row at a pixel boundary between two rows of pixels for use with at least three rows of pixels.

* * * * *